United States Patent [19]

McGalliard

[11] 4,112,312
[45] Sep. 5, 1978

[54] FLUID SENSITIVE SWITCHING MEMBER

[76] Inventor: James D. McGalliard, 11171 Fenwick Pl., Santa Ana, Calif. 92705

[21] Appl. No.: 777,183

[22] Filed: Mar. 14, 1977

[51] Int. Cl.² .................................. H01H 35/18
[52] U.S. Cl. ........................ 307/118; 307/252 B; 361/178
[58] Field of Search ............... 307/118, 117, 200 R, 307/305, 308, 252 B; 340/244 R, 244 C; 200/289, 61.04, 61.05, 61.2; 357/82, 81; 361/178; 137/558

[56] References Cited

U.S. PATENT DOCUMENTS

| | | | |
|---|---|---|---|
| 3,196,679 | 7/1965 | Howland | 73/204 |
| 3,244,833 | 4/1966 | Gillett | 200/82 R |
| 3,696,362 | 10/1972 | Sieron | 340/244 C |
| 3,734,123 | 5/1973 | Pomerantz | 361/178 |
| 3,794,886 | 2/1974 | Goldman | 174/15 R |
| 3,881,181 | 4/1975 | Khajezadeh | 338/25 |
| 3,893,161 | 7/1975 | Pesak | 357/81 |
| 3,944,845 | 3/1976 | Luteran | 307/118 |

Primary Examiner—L. T. Hix
Assistant Examiner—S. D. Schreyer
Attorney, Agent, or Firm—Knobbe, Martens, Olson, Hubbard & Bear

[57] ABSTRACT

A solid state fluid sensitive switching member which utilizes fluid contained in a cavity to conduct the heat generated during high current switching operations away from the temperature-sensitive solid state elements of the switching member. A heat sinc tab thermally connected to the solids state elements is positioned in the cavity where the presence or absence of a fluid is to be monitored. When fluid is present in this cavity, the solid state elements which produce heat are in a closed circuit configuration and the heat sinc tab directly conducts heat from the heat-producing solid state members into the fluid being monitored. When no fluid is present in the monitored fluid cavity, the heat sinc potentials of such fluid are absent. However, in this configuration the solid state circuit elements are in an open circuit configuration and do not produce substantial amounts of heat, so that no heat sinc is required. Thus, the present invention takes advantage of the fact that the only time the circuit elements require cooling is when fluid which is being monitored is present, and the fluid itself may therefor be used as a heat sinc for the solid state members.

10 Claims, 4 Drawing Figures

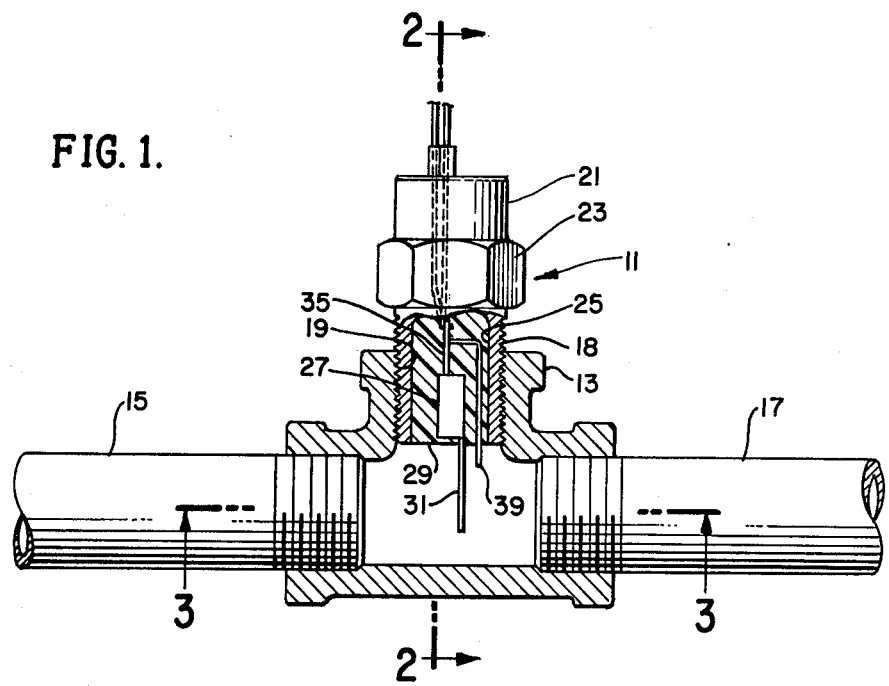
FIG. 1.
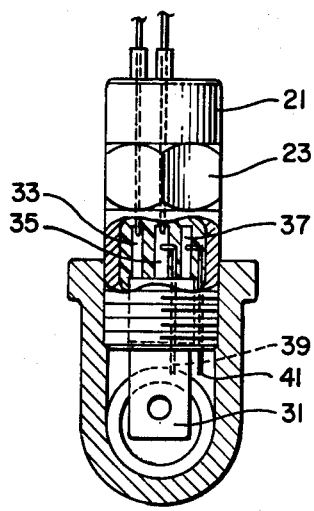
FIG. 2.
FIG. 3.
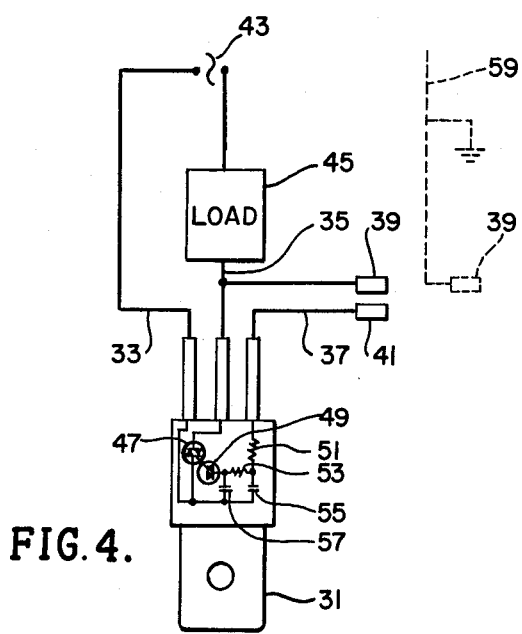
FIG. 4.

FLUID SENSITIVE SWITCHING MEMBER

BACKGROUND OF THE INVENTION

It has been well known in the prior art to utilize solid state circuit assemblies for monitoring the presence of a fluid in a conduit or vessel. For example, such fluid presence sensors may be used in multiples as fluid level detectors in large fluid vessels, or may be used singly in flow conduits to protect machinery, for example, which would be damaged if fluid were not present in the conduit.

Prior art devices exist for sensing the presence or absence of a fluid, for example, water in the cavity, typically by means of a pair of electrodes exposed to the fluid. These devices generally consist of a solid state circuit for monitoring the resistance of the path between the two electrodes and thereby determining, through a reduction in this resistance path, that the monitored fluid is present. Typically, the electrodes in such devices are connected to a high gain, solid state amplifier which, in turn, drives a high current switching device used for operating equipment in response to the presence or absence of fluid. For example, if such detectors are used as level sensors in a fluid reservoir, the absence of fluid at a given level in the reservoir may trigger a pump to pump fluid to the reservoir. Alternatively, the presence of fluid at a higher level in the reservoir may be used to activate a pump to withdraw fluid from the reservoir.

In the prior art it has been common to utilize a relay as the high current switching device in order to avoid temperature problems within the switching member. Alternatively, solid state devices have been used in some prior art installations, in which case the high current switching transistor or other high current switching device generally requires a substantial heat sinc mounted outside of the fluid cavity or conduit for cooling the solid state switching device. The requirement for a relay, of course, substantially increases the size of the switching element as well as its cost, while at the same time reducing its long term reliability. On the other hand, the requirement of alternate prior art devices for heat sinc members, along with possible air cooling fins and, in some instances, fans for cooling these fins, substantially increases the complexity and cost of the monitoring system while at the same time increasing the labor costs involved in the installation of the sensor.

SUMMARY OF THE INVENTION

The present invention overcomes the disadvantages of the prior art by utilizing the fluid within the conduit or cavity being monitored as a heat sinc for the current solid state switching device within the sensing system. In this instance, it is required that the switching element be connected to the electrodes such that the high current switching device is in a closed circuit configuration when is present in the cavity or conduit and in an open circuit configuration when fluid is absent. Thus, the high current state device, which produces substantial heat only during switching and during closed circuit operation, may be directly cooled by the fluid being monitored. When no fluid is present in the cavity or conduit, the heat sinc potential of the fluid is lost. However, the present invention recognizes the fact that the open circuit switching device does not produce substantial heat which could cause damage to that device when it is in its open circuit configuration, so that the heat producing cycles concur with the heat sinc availability cycle.

The use of the monitored fluid as the heat sinc for the solid state switching device permits a very simple device construction, reducing both the cost of the device itself and the complexity of installation of the device into the wall of the cavity or conduit to be monitored.

The detailed construction of the preferred embodiment is best understood through a reference to the drawings, in which:

FIG. 1 is an elevation view of the sensor of the present invention installed in a flow conduit, the view being partially in section;

FIG. 2 is a sectional view along lines 2—2 of FIG. 1;

FIG. 3 is a sectional view taken along 3—3 of FIG. 1; and

FIG. 4 is a schematic view showing the elements of the sensing and switching member of the present invention and the interconnections of this member with an external load.

DETAILED DESCRIPTION OF THE PREFERRED EMBODIMENT

Referring initially to FIG. 1, the fluid level sensor 11 of the present is shown threaded into a standard pipe tee 13 which is in turn threaded in series with a flow conduit including an inlet pipe 15 and an outlet pipe 17. The sensor 11 itself is incorporated in a cylindrical sleeve 18 typically formed of metal or plastic and including pipe threads 19 on its external diameter at the lower end, as viewed in FIG. 1, for threading and sealing with the pipe threads of the tee 13. The other end of the sensor 11 may include a smooth outer diameter 21, and the central portion may form a nut member 23 to facilitate threading the sensor 11 into the tee 13. The inner diameter 25 of the sleeve 18 has a smooth, constant diameter throughout, so that the sleeve 18 is open at both ends.

The solid state sensing and switching member 27, which will be described in more detail below, is centrally mounted within sleeve 18 as by epoxy 29 used to fill the entire inner diameter 25 of the sleeve 18 while at the same time mounting the circuit 27 and protecting it from moisture. The circuit 27 includes an extending heat sinc tab 31 which extends into the flow conduit within the pipe tee 13 for direct contact with the fluid flowing from the inlet pipe 15. The tab 31 extends beyond the epoxy 29 but is sealed by the epoxy within the sleeve 18 to prohibit moisture contamination of the switching circuit 27.

The switching circuit 27 includes three electrical terminals 33, 35, and 37, which extend from the circuit 27 on the side opposite the tab 31. Two of these terminals, 35 and 37, are connected to electrode members 39 and 41, respectively, which are in the form of bare wires extending into the fluid conduit within the pipe tee 13. The electrical resistance between the electrodes 39 and 41 determines the switching state of the sensing member 27. These electrodes, 39 and 41, are mounted in the epoxy 29 and insulated thereby from the main circuit case of the assembly 27 and the sleeve 18.

The conductors 33 and 35 each extend through the epoxy 29 to exit from the end 21 of the sensor assembly, and may be insulated from the interface of this assembly to their point of connection at the power source and load.

As particularly shown in FIG. 1, the heat sinc tab 31 extends to a lower level within the pipe tee 13 than do the electrodes 39 and 41. Substantial heat is produced by the solid state devices within the switching assembly 27 during closed circuit operation and during switching operations. The switching of such devices, which normally alternate between a saturated and open circuit configuration, occurs very rapidly, and it will be seen that, since switching will occur as the liquid interface clears the bottom of the electrodes 39 and 41, the heat sinc tab 31 will still be immersed in the flowing liquid at this time. Thus, if the inlet and outlet pipes 15, 17 and tee 13 are full of liquid, for example, water, the solid state, high current switching member of the assembly 27 will be in a closed circuit configuration and will be producing heat, which will be dissipated into the fluid stream by the heat sinc tab 31. As the conduits 15, 17 and tee 13 are emptied, the water level first passes below the electrodes 39 to open circuit the current carrying elements of the assembly 27, while the heat sinc tab 31 is still partially immersed in the liquid and still may dissipate the heat caused by the switching action of this device. Alternatively, when the circuit is in an open configuration, and the conduits 15 and 17 are empty, fluid entering the conduits will first rise to a level which contacts the heat sinc tab 31. Thus, by the time the fluid level reaches the electrodes 39 and 41, the heat capability of fluid on the tab 31 is present. Obviously, if the fluid conduit 15, 17 is such that flow is likely to be initiated and stopped abruptly, so that the conduits 15, 17 are either generally completely full or completely empty, this particular relationship between the heat sinc tab 31 and electrodes 39,41 is not as significant.

Referring now to FIG. 4, the general circuit configuration of the switching element and its load will be described. A power source, such as an AC source 43, supplys current to the terminal 33 and to the terminal 35 in series with a load 45. When the electrodes 39 and 41 are immersed in liquid, the switching assembly 27 closes the circuit between the source 43 and load 45 to directly switch the load 45. It can thus be seen that the present invention requires a load 45 which is to be driven whenever fluid is present in the conduit. Such a situation may exist, for example, when a water heater is to be applied to fluid within the conduit 15, 17 of FIG. 1, which water heater might, for example, be damaged if it were operated when the fluid did not exist within the conduit 15, 17. In this instance, the water heater would be the load 45, and the source 43 would be a current sufficient to operate this heater. Whenever fluid is present in the conduit 15,17, the water heater would be made to operate, but would be open circuited when water was not present. In an alternate example, the sensor 11 may be placed in a reservoir which is connected to a pump which withdraws water or other fluid from the reservoir whenever its level exceeds the level of the electrodes 39,41. In this instance, the load 45 would constitute this pump, which would be operated in response to high fluid levels within the reservoir.

Since heat is produced by the assembly 27 only when its elements are switching or closed circuited, heat is produced only at times when the heat since tab 31 is immersed in fluid. Thus, the novel characteristic of the present device is the fact that the heat dissipation cycles are concurrent with the fluid cycles of the fluid being monitored so that even though the fluid is absent from the heat sinc tab 31 at certain times, these times are precisely the times when no heat is produced by the circuit. Thus, the sensed flow stream itself may serve as a convenient heat sinc for this device.

Turning now to the details of the sensing and switching assembly 27 as shown in FIG. 4, the circuit may conveniently be identical to that shown in RCA Thyristors Application Note AN-3778 and is a well known circuit. This circuit includes the combination of a triac 47 connected to a diac 49 to control the AC current supplied to the load 45. In this instance, one of the electrodes 39 is connected directly to the load line in series with the triac 47 while the remaining sensor electrode 41 is connected through a pair of resistors 51 and 53 and a pair of capacitors 55 and 57 to trigger the diac/triac combination 49/47. A circuit such as that included in the sensing and switching assembly 27 is sold by Electramation, the assignee of the present invention under the tradename "Solidstat" and, as stated before, is well known in the electronics art.

While this particular circuit has been described in this preferred embodiment, it will be understood that many well known circuits may be used in the sensing and switching circuit 27, so long as they operate to close the circuit to the load 45 in response to a reduction in the resistance between the electrodes 39 and 41 which may be induced by the presence in the flow conduit 13. It will also be understood that means other than the actual resistance of the liquid sensed by electrodes 39 and 41 may be used for sensing the presence of fluid in the conduit 39, so long as it is a monitoring of the presence of such a fluid which closes the circuit of the switching device 27.

In addition to these changes, it is also advisable in situations where potential safety hazards from electrical shocks exist, to interconnect the electrode 39 as shown in the dashed alternative connection schematic of FIG. 4. In this instance, the electrode 39, rather than being connected to the load line 35, is connected to a ground line 59, which is a third wire connected to the sensor. The ground line 59 is externally connected to earth ground as shown in the dashed line configuration of FIG. 4 and, in this case, the fluid within the conduit must also be grounded as, for example, by grounding the pipe tee 13. This change will remove any potential shock hazards from the fluid within the conduit while, at the same time, permitting the solid state device to operate as previously described.

It should also be understood in reference to this patent application that many solid state switching devices, even though heated to temperatures above their normal operating range, may continue to function but their characteristics will be degraded to some extent. Thus, the present invention is particularly applicable to switching elements which are subject to performance degradation or actual damage in response to being overheated and, in this regard, when used in the present application, self-degarding heat will be considered to be heat sufficient to degrade the performance of the switching elements or to damage them.

What is claimed is:

1. A device for electrically connecting a power source to a load in response to the presence of a fluid within a cavity, comprising:
    means for sensing the presence of said fluid within said cavity;
    a high current solid state switching device responsive to said sensing means and connected in series between said power source and said load, said switching device closing the circuit between said power source and load when fluid is in said cavity and opening the circuit between said power source and load when fluid is absent from said cavity, said switching device producing heat sufficient to degrade said switching device when said switching device closes said circuit unless said switching device is cooled, said switching device not producing such self-degrading heat when said switching device opens said circuit; and means for conducting heat from said high current switching means to said fluid within said cavity to cool said switching device when said heat conducting means is in direct contact with said fluid in said cavity, said conducting means being incapable of cooling said high current switching means when fluid is absent from said cavity.

2. A fluid presence sensitive switch for mounting in a fluid cavity, comprising:

means for sensing the presence or absence of fluid in said cavity;

switching means responsive to said sensing means, said switching means responding to said sensing means to produce sufficient heat, unless cooled, to degrade said switching means when fluid is present in said cavity, but insufficient heat to degrade said switching means when fluid is absent from said cavity; and means for conducting heat from said switching means to fluid within said cavity, said conductive means cooling said switching means when said conducting means is in direct contact with said fluid in said cavity, said conductive means being incapable of cooling said switching means when fluid is absent from said cavity.

3. A fluid presence sensitive switch as defined in claim 2 wherein said switching means comprises a solid state switching element and wherein said heat conducting means conducts heat from said solid state switching element to fluid within said cavity.

4. A fluid presence sensitive switch as defined in claim 3 wherein said heat conducting means comprises a heat conductive tab extending from said solid state switching means into said cavity.

5. A fluid presence sensitive switch as defined in claim 4 wherein said sensing means comprises electrodes extending into said cavity and responsive to the change in resistance induced by the presence of fluid in said cavity.

6. A fluid presence sensitive switch as defined in claim 5 wherein said heat conducting tab extends to a lower elevation within said cavity than do said electrodes.

7. A fluid presence sensitive switch as defined in claim 2 additionally comprising a load switched by said switching means, said switching means comprising a triac series connected with said load.

8. A fluid responsive switch for mounting in a fluid cavity, comprising:

means for sensing the presence of fluid within said cavity;

switching means opening and closing in response to said sensing means, said switching means producing heat sufficient to degrade said switching means when said switching means is closed unless said switching means is cooled, said switching means not producing such self-degrading heat when said switching means is open; and means for dissipating heat from said switching means to said fluid in said cavity.

9. A fluid responsive switch for mounting in a fluid cavity as defined in claim 8 wherein said means for dissipating heat cools said switching means when said dissipating means is in direct contact with said fluid in said cavity, said dissipating means being incapable of cooling said switching means when fluid is absent from said cavity.

10. A fluid responsive switch for mounting in a fluid cavity as defined in claim 9 wherein said switching means is a heat susceptible solid state circuit.

* * * * *

UNITED STATES PATENT AND TRADEMARK OFFICE
CERTIFICATE OF CORRECTION

PATENT NO. : 4,112,312
DATED : September 5, 1978
INVENTOR(S) : James D. McGalliard It is certified that error appears in the above-identified patent and that said Letters Patent are hereby corrected as shown below:

Column 1, line 18, after "two" insert --spaced--;

Column 1, line 54, after "the" and before "current" insert --high--;

Column 1, line 59, after "when" insert --fluid--;

Column 1, line 61, after "current" insert --solid--;

Column 2, line 15, after "view" insert --taken--;

Column 2, line 16, after "along" insert --lines--;

Column 2, line 26, after "present" insert --invention--;

Column 3, line 26, after "heat" insert --sinc--.

Signed and Sealed this

Tenth Day of April 1979

[SEAL]

Attest:

RUTH C. MASON
Attesting Officer

DONALD W. BANNER
Commissioner of Patents and Trademarks